(12) United States Patent
Henderson et al.

(10) Patent No.: US 8,127,940 B2
(45) Date of Patent: Mar. 6, 2012

(54) RAIL INCLUDING A SHELF FOR SUPPORTING AN INFORMATION HANDLING SYSTEM

(75) Inventors: Gregory Henderson, Round Rock, TX (US); Riyad Moe, Temple, TX (US); Stephen Wotherspoon, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 62 days.

(21) Appl. No.: 12/330,263

(22) Filed: Dec. 8, 2008

(65) Prior Publication Data

US 2010/0140195 A1   Jun. 10, 2010

(51) Int. Cl.
*A47F 7/00* (2006.01)
(52) U.S. Cl. ...................... 211/26; 312/334.5
(58) Field of Classification Search .................. 211/26, 211/26.2, 162, 94.01; 312/223.3, 334.4, 312/334.5, 334.7; 361/825
See application file for complete search history.

(56) References Cited

U.S. PATENT DOCUMENTS

| | | | | |
|---|---|---|---|---|
| 3,677,615 A | * | 7/1972 | Hudson | 384/20 |
| 5,408,939 A | * | 4/1995 | Lechman | 108/107 |
| 5,586,003 A | * | 12/1996 | Schmitt et al. | 361/679.58 |
| 6,049,451 A | * | 4/2000 | Schmitt et al. | 361/679.33 |
| 6,220,456 B1 | | 4/2001 | Jensen et al. | 211/26 |
| 6,378,966 B1 | * | 4/2002 | Baker et al. | 312/333 |
| 6,888,069 B1 | * | 5/2005 | Chen et al. | 174/99 R |
| 7,258,568 B2 | * | 8/2007 | Shih | 439/377 |
| 7,286,348 B2 | | 10/2007 | Vinson et al. | 361/695 |
| 2002/0074914 A1 | * | 6/2002 | Shih | 312/334.4 |
| 2005/0052102 A1 | * | 3/2005 | Lauchner | 312/334.5 |
| 2005/0087504 A1 | * | 4/2005 | Wu | 211/26 |

OTHER PUBLICATIONS

Dell PowerEdge Rail Kit,http://www.racksolutions.com/dell-poweredge-2450-2550-2650-rail-kit.shtml, 1 page, Dec. 11, 2008.

* cited by examiner

*Primary Examiner* — Darnell Jayne
*Assistant Examiner* — Patrick Hawn
(74) *Attorney, Agent, or Firm* — Baker Botts L.L.P.

(57) ABSTRACT

A rack system for supporting one or more information handling systems is provided. The rack system may include a rack and one or more rails coupled to the rack and configured to support one or more information handling systems. At least one of the rails may include an upper support structure, a lower support structure, a slot defined between the upper and lower support structures and configured to receive a guide structure of the information handling system, and a shelf. The slot may have a front end opening proximate to a front end of the rail, and extend toward a back end of the rail. The shelf may extend forward from the front end opening of the slot, and can support a portion of the information handling system when the guide structure is not received in the slot. The shelf may also not be coupled to any other rail.

14 Claims, 6 Drawing Sheets

RAIL INCLUDING A SHELF FOR SUPPORTING AN INFORMATION HANDLING SYSTEM

TECHNICAL FIELD

The present disclosure relates in general to information handling systems, and more particularly to a rail having a shelf for physically supporting an information handling system.

BACKGROUND

As the value and use of information continues to increase, individuals and businesses seek additional ways to process and store information. One option available to users is information handling systems An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Increasingly, information handling systems are deployed in systems that include multiple information handling systems arranged in racks and supported by rails, which may consolidate the physical space required to store, maintain and/or operate the information handling systems. However, a rack and rail system supporting multiple information handling systems often creates some difficulties for inserting and removing information handling systems to and from the rack.

SUMMARY

In accordance with certain embodiments of the present disclosure, a rack system for supporting one or more information handling systems includes a rack and one or more rails coupled to the rack and configured to support one or more information handling systems. At least one of the rails includes an upper support structure, a lower support structure, a slot defined between the upper and lower support structures and configured to receive a guide structure of the information handling system, and a shelf. The slot has a front end opening proximate to a front end of the rail, and extends toward a back end of the rail. The shelf extends forward from the front end opening of the slot, and can support a portion of the information handling system when the guide structure is not received in the slot.

In accordance with certain embodiments of the present disclosure, a rail system for supporting one or more information handling systems includes one or more rails configured to support one or more information handling systems. At least one of the rails includes an upper support structure, a lower support structure, a slot defined between the upper and lower support structures and configured to receive a guide structure of the information handling system, and a shelf. The slot has a front end opening proximate to a front end of the rail, and extends toward a back end of the rail. The shelf extends forward from the front end opening of the slot, and can support a portion of the information handling system when the guide structure is not received in the slot.

In accordance with certain embodiments of the present disclosure, an information handling system includes a rack, a plurality of information handling systems, and one or more rails coupled to the rack and configured to support one or more information handling systems. At least one of the rails includes an upper support structure, a lower support structure, a slot defined between the upper and lower support structures and configured to receive a guide structure of the information handling system, and a shelf. The slot has a front end opening proximate to a front end of the rail, and extends toward a back end of the rail. The shelf extends forward from the front end opening of the slot, and can support a portion of the information handling system when the guide structure is not received in the slot.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 9, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Figure 1:
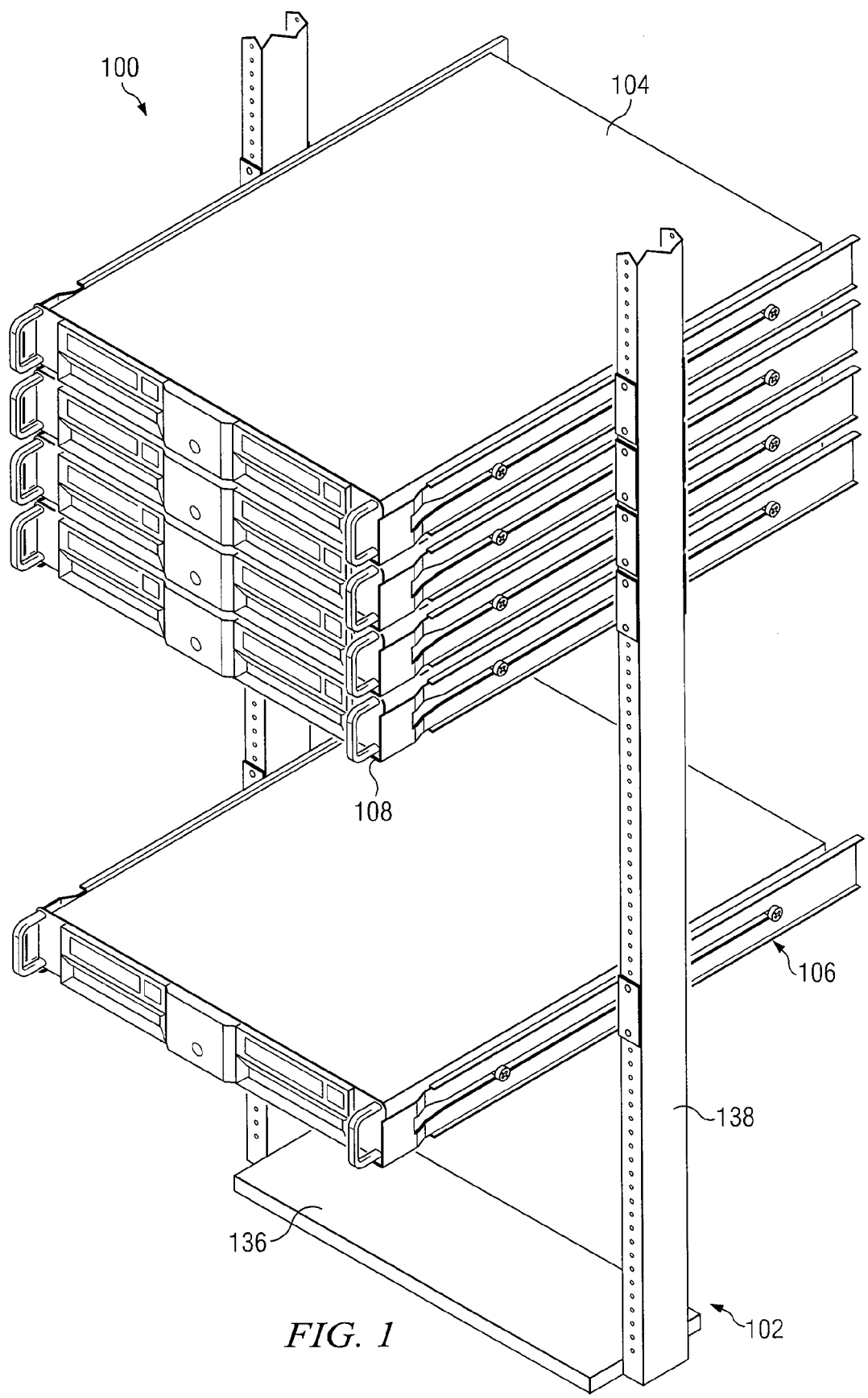
FIG. 1 illustrates an example rack system for supporting one or more information handling systems, including one or more support rails having a supporting shelf, in accordance with certain embodiments of the present disclosure.

FIG. 1 illustrates a system 100 for supporting one or more information handling systems (IHSs) 104, according to certain embodiments of the present disclosure. System 100 includes a rack 102 and one or more pairs of rails 106. Rack 102 is, in some embodiments, a framework with a base 136, posts 138, and a cap, capable of housing or supporting multiple IHSs 104. In some embodiments, rack 102 may be a two-post 19-inch wide rack capable of housing up to 42 rack units, each rack unit approximately 1.75 inches tall, such as that described by standard EIA-310-D, promulgated by the Electronic Industries Association. However, in other embodiments, rack 102 may include any other number of posts (e.g., four), may include one or more walls, may include a door, may have different dimensions (e.g., a 23-inch wide rack), may be configured to house or support a different number of rack units, or may be a custom enclosure with non-standard dimensions.

In some embodiments, one or both of a pair of rails 106 configured to support an IHS 104 may include a shelf 108 configured to support a portion of the IHS 104, e.g., during insertion and/or removal of the IHS 104 from rack 102. Each rail 106 may be a unitary piece of sheet metal, or may be made of multiple pieces, or from aluminum, plastic, or any suitably rigid material capable of supporting a portion of IHS 104. Each rail 106 connects to a post 138 such that a pair of rails 106 connect to opposite posts 138 in order to support an IHS 104. In some embodiments, a pair of rails 106 may support a single IHS 104 (e.g., a server), or may support multiple IHSs 104 (e.g., certain digital video equipment that requires less than the full width of rack 102).

Shelf 108 is configured to support a portion of an IHS 104 during installation and/or removal of the IHS 104 from rack 102. In some embodiments, shelf 108 and rail 106 are formed integrally (e.g., a single piece of sheet metal). In other embodiments, shelf 108 and rail 106 may be separate pieces connected in any suitable manner (e.g., using screws or other fasteners, by welding, etc.). Each of shelf 108 and rail 106 may be formed from any suitable materials, e.g., steel, aluminum, plastic, or any other suitably rigid material capable of supporting all or a portion of an IHS 104. Example embodiments of rail 106 and shelf 108 are described in greater detail below with reference to FIGS. 2-8.

Figure 2:
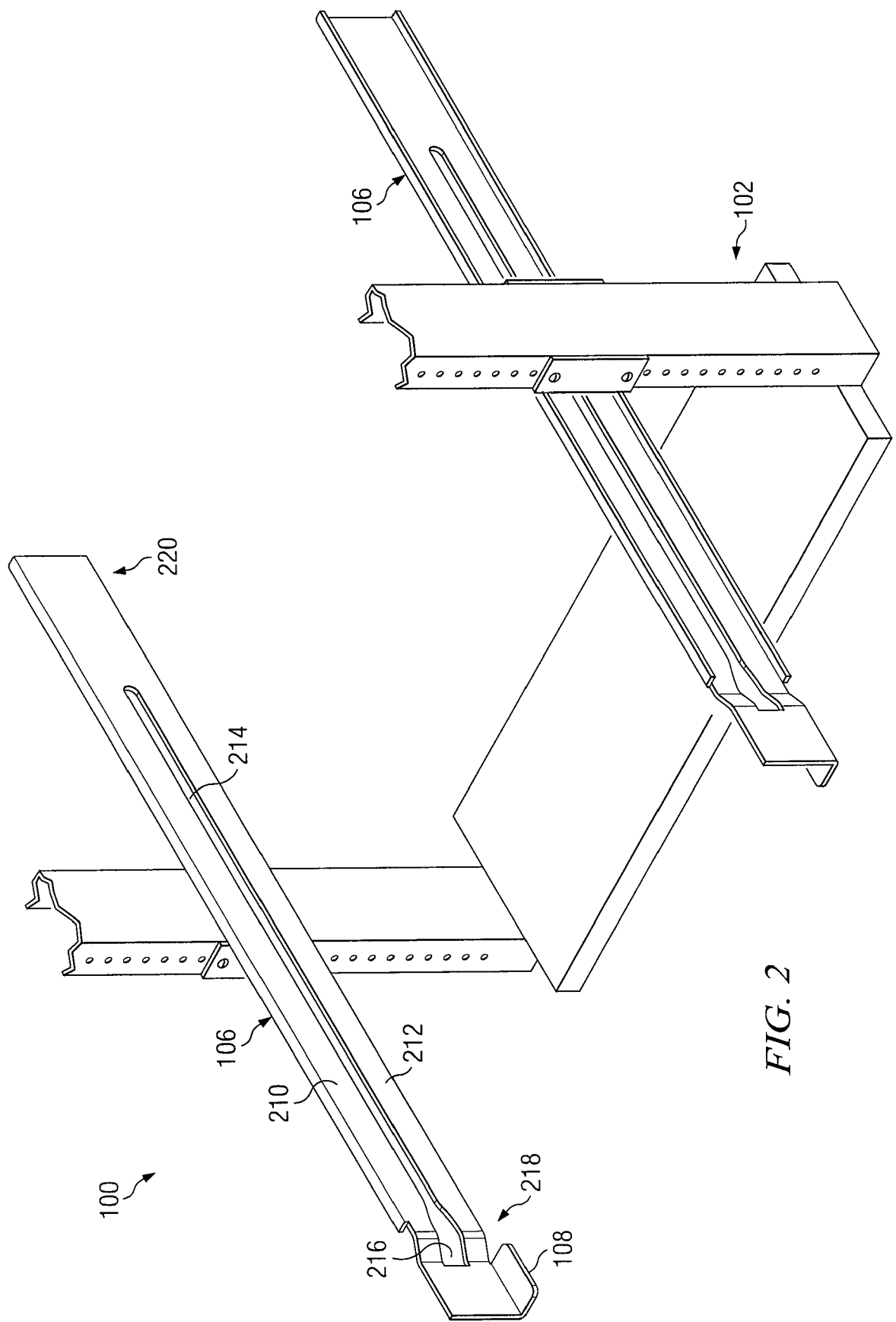
FIG. 2 illustrates the rack system of FIG. 1 with only a single pair of rails attached to the rack, in accordance with certain embodiments of the present disclosure.

FIG. 2 illustrates system 100 with only a single pair of rails 106 connected to rack 102, according to certain embodiments of the present disclosure. In some embodiments, one or both of the pair of rails 106 includes an upper support structure 210, a lower support structure 212, a slot 214 defined between upper support structure 210 and lower support structure 212, and a shelf 108 extending forward from a front end opening 216 of slot 214. The illustrated pair of rails 106 connect to opposite sides of rack 102, such that the pair of rails 106 is capable of supporting one or more IHSs, as described in more detail above with reference to FIG. 1.

In some embodiments, upper support structure 210 and lower support structure 212 are an integral component, whereas in other embodiments, upper support structure 210 and lower support structure 212 are separate elements that are coupled together in any suitable manner. Upper support structure 210 and lower support structure 212 may be formed from steel, aluminum, plastic, or any other suitably rigid material capable of supporting an IHS. Upper support structure 210 and lower support structure 212 may physically support an IHS in various translational and/or rotational directions. For example, upper support structure 210 and lower support structure 212 may provide vertical support from both the top and the bottom (support form the top may be helpful, e.g., during transport of rack 102), horizontal support to prevent an IHS from sliding out of the back sides of the rails, and/or rotational support to prevent/resist rotation of an IHS (e.g., to prevent/resist the front, back, a side, or a corner of an IHS from flexing or rotating downward or upward). In some embodiments, rail 106 may include a structure connected to upper support structure 210 and/or lower support structure 212 to prevent IHS from sliding horizontally out of the back of a pair of rails 106 In other embodiments, upper support structure 210 and lower support structure 212 join together toward the rear of rail 106 to provide a physical "stop" for preventing IHS from sliding horizontally out of the back of a pair of rails 106. Such physical support may help prevent or reduce damage to the IHS or its internal components.

Figure 6:
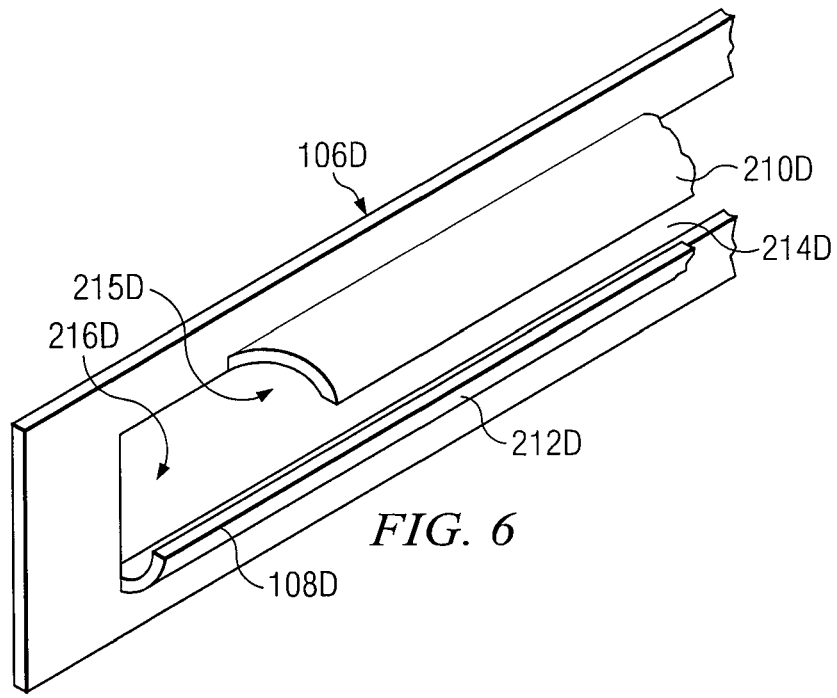
FIG. 6 illustrates a fourth example rail having a shelf for supporting an information handling system, in accordance with certain embodiments of the present disclosure.
Figure 7:
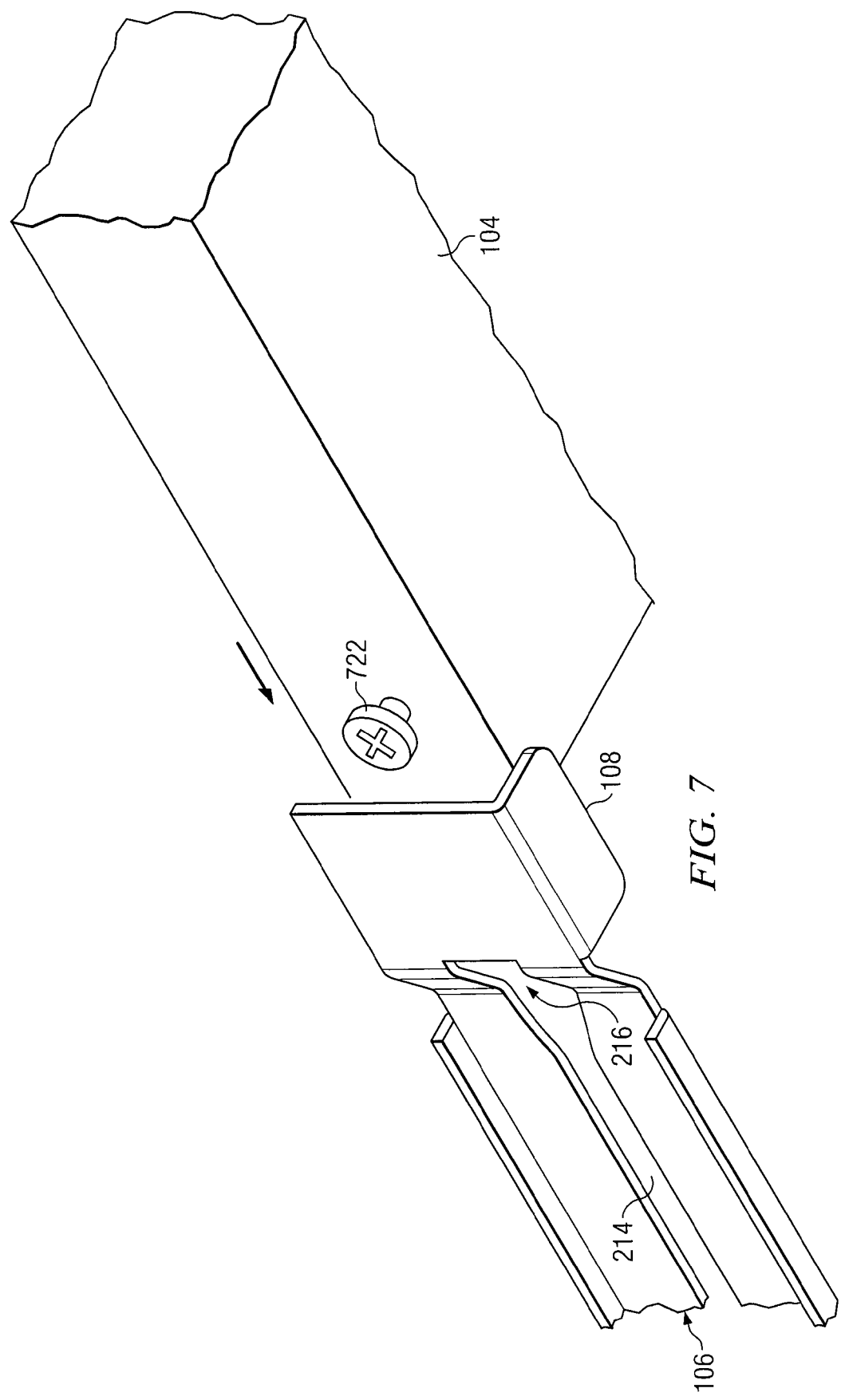
FIG. 7 illustrates an example shelf (e.g., any of the example shelves shown in FIGS. 3-6) supporting a portion of an information handling system, in accordance with certain embodiments of the present disclosure.

Slot 214 may be configured to receive one or more guide structures of an IHS (e.g., guide structures 722 shown in FIG. 7). Slot 214 includes a front end opening 216 proximate to a front end 218 of rail 106, and extends toward a back end 220 of rail 106. Front end opening 216 may be configured to initially receive one or more guide structures of the IHS. In some embodiments, slot 214 or front end opening 216 may include a flared portion to provide greater access for, or to help guide, the guide structures, as described in more detail in FIGS. 3-6. The interaction of guide structures with slot 214 and front end opening 216 are described in greater detail below with reference to FIG. 8.

Shelf 108 is configured to support a portion of an IHS during installation and/or removal of the IHS from a pair of rails 106. Example embodiments and operation of shelf 108 are described in greater detail below with reference to FIGS. 3-8.

Figure 3:
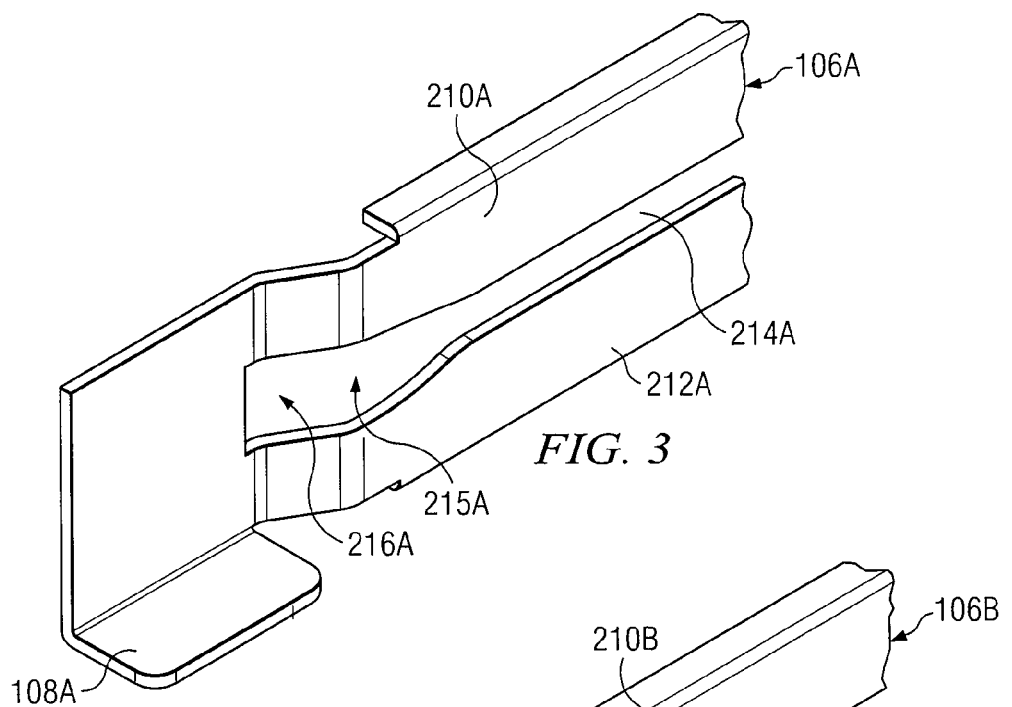
FIG. 3 illustrates a first example rail having a shelf for supporting an information handling system, in accordance with certain embodiments of the present disclosure.

FIGS. 3-6 illustrate some example embodiments of rails 106 having a shelf 108 for supporting an IHS. FIG. 3 illustrates a first example rail 106A having a shelf 108A for supporting an information handling system, according to certain embodiments of the present disclosure. Rail 106A includes upper support structure 210A, a lower support structure 212A, a slot 214A defined between upper support structure 210A and lower support structure 212A, and shelf 108A, extending forward from a front end opening 216A of slot 214A. In some embodiments, upper support structure 210A and lower support structure 212A are configured to provide horizontal, vertical, and/or rotational support to the IHS, as described in more detail above with reference to FIG. 2.

In some embodiments, shelf 108A is a substantially horizontal member capable of supporting a portion of an IHS for installation and/or removal of the IHS from rail 106A. Shelf 108A may support a portion of an IHS during installation by a person so that the person may more easily align a guide structure (e.g., guide structures 722 shown in FIG. 7) of an IHS with the front end opening 216A of slot 214A, as described in more detail below with reference to FIG. 8. During removal of the IHS from rail 106A by a person, shelf 108A may support a portion of the IHS after the last guide structure has exited slot 214A so that the person may not need to immediately support the entire weight of the IHS, thus reducing the chances of dropping or damaging the IHS.

In some embodiments, slot 214A or front end opening 216A may include a flared portion 215A that may provide greater access for the guide structures, e.g., to help guide the guide structures into the front end opening 216A of slot 214A. The interaction of the guide structures, slot 214A, and front end opening 216A are described in greater detail below with reference to FIG. 8.

Figure 4:
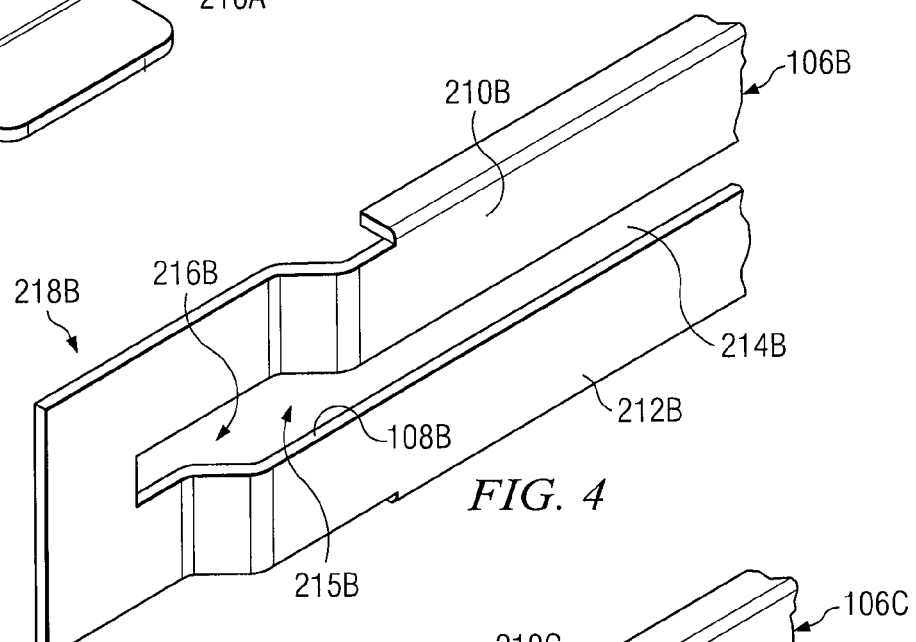
FIG. 4 illustrates a second example rail having a shelf for supporting an information handling system, in accordance with certain embodiments of the present disclosure.

FIG. 4 illustrates a second example rail 106B having a shelf 108B for supporting an information handling system, according to certain embodiments of the present disclosure. Rail 106B includes an upper support structure 210B, a lower support structure 212B, a slot 214B defined between upper support structure 210B and lower support structure 212B, and a shelf 108B extending forward from a front end opening 216B of slot 214B. In some embodiments, upper support structure 210B and lower support structure 212B are configured to provide horizontal, vertical, and/or rotational support to the IHS, as described in more detail above with reference to FIG. 2.

In some embodiments, shelf 108B and lower support structure 212B are an integral component, whereas in other embodiments, lower support structure 212B and shelf 108B are separate elements. In some embodiments, a portion of front end 218B of rail 106B may flare outwardly relative to an opposing rail 106B in rack 102, which may provide greater access to shelf 108B, e.g., to improve support of the IHS during installation and/or removal of the IHS from rail 106B. Shelf 108B may support a portion of the IHS during installation by a person so that the person may more easily align a guide structure (e.g., guide structures 722 shown in FIG. 7) of an IHS with the front end opening 216B of slot 214B, as described in more detail below with reference to FIG. 8. During removal of the IHS from rail 106B by a person, shelf 108B may support a portion of the IHS so that the person may not need to immediately support the entire weight of the IHS, thus reducing the chances of dropping or damaging the IHS.

In some embodiments, slot 214B or front end opening 216B may include a flared portion 215B that may provide greater access for the guide structures, e.g., as discussed above regarding flared portion 215A.

Figure 5:
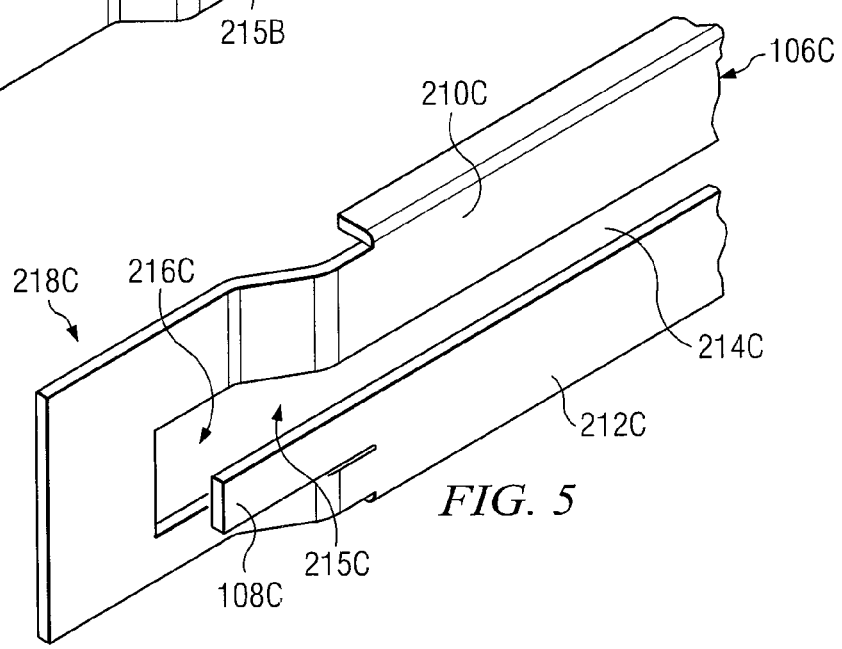
FIG. 5 illustrates a third example rail having a shelf for supporting an information handling system, in accordance with certain embodiments of the present disclosure.

FIG. 5 illustrates a third example rail 106C having a shelf 108C for supporting an information handling system, according to certain embodiments of the present disclosure. Rail 106C includes an upper support structure 210C, a lower support structure 212C, a slot 214C defined between upper support structure 210C and lower support structure 212C, and a shelf 108C, extending forward from a front end opening 216C of slot 214C. In some embodiments, upper support structure 212C and lower support structure 212C are configured to provide horizontal, vertical, and/or rotational support to the IHS, as described in more detail above with reference to FIG. 2.

In some embodiments, lower support structure 212C splits such that a portion of a split section forms shelf 108C. In some embodiments, a portion of front end 218C of rail 106C may flare outwardly relative to an opposing rail 106 in rack 102, which may provide greater access to shelf 108C, e.g., to improve support of the IHS during installation and/or removal of the IHS from rail 106C. Shelf 108C may support a portion of the IHS during installation by a person so that the person may more easily align a guide structure (e.g., guide structures 722 shown in FIG. 7) of an IHS with the front end opening 216C of slot 214C, as described in more detail below with reference to FIG. 8. During removal of the IHS from rail 106C by a person, shelf 108C may support a portion of the IHS so that the person may not need to immediately support the entire weight of the IHS, thus reducing the chances of dropping or damaging the IHS.

In some embodiments, slot 214C or front end opening 216C may include a flared portion 215C that may provide greater access for the guide structures, e.g., as discussed above regarding flared portion 215A.

FIG. 6 illustrates a fourth example rail 106D having a shelf 108D for supporting an information handling system, according to certain embodiments of the present disclosure. Rail 106D includes an upper support structure 210D, a lower support structure 212D, a slot 214D defined between upper support structure 210D and lower support structure 212D, and a shelf 108D extending forward from a front end opening 216D of slot 214D. In some embodiments, upper support structure 210B and lower support structure 212B are configured to provide horizontal, vertical, and/or rotational support to the IHS, as described in more detail above with reference to FIG. 2.

In some embodiments, upper support structure 210D, lower support structure 212D, and shelf 108D are an integrated, substantially horizontal boss protruding from a substantially flat piece of metal (e.g., steel or other suitable material). Shelf 108D may support a portion of the IHS during installation by a person so that the person may more easily align a guide structure (e.g., guide structures 722 shown in FIG. 7) of an IHS with the front end opening 216D of slot 214D, as described in more detail below with reference to FIG. 8. During removal of the IHS from rail 106D by a person, shelf 108D may support a portion of the IHS so that the person may not need to immediately support the entire weight of the IHS, thus reducing the chances of dropping or damaging the IHS.

In some embodiments, slot 214D or front end opening 216D may include a flared portion 215D that may provide greater access for the guide structures, e.g., as discussed above regarding flared portion 215A.

FIG. 7 illustrates an example shelf 108 supporting a portion of an information handling system 104 from below IHS 104, according to certain embodiments of the present disclosure. Shelf 108 shown in FIG. 7 may be any shelf according to the teachings of this disclosure, e.g., any of the shelves 108 shown in FIGS. 3-6. Shelf 108 may support a rear portion of IHS 104 during installation by a person so that the person may more easily align a guide structure 722 of an IHS 104 with a front end opening 216 of a slot 214 formed in each of a pair of rails 106. Thus, for example, a person may rest the back edge of an IHS 104 on shelf 108 of a pair of rails 106 and then slide the IHS back such that the guide structures 722 slide into front end openings 216 of slots 214 formed in each of the rails 106. During removal of the IHS from rail 106 by a person, shelf 108 may support a rear portion of IHS 104 after the last guide structure 722 has exited from slots 214 formed in the pair of rails 106 so that the person need not immediately support the entire weight of IHS 104, reducing the chances of dropping or damaging IHS 104.

Figure 8:
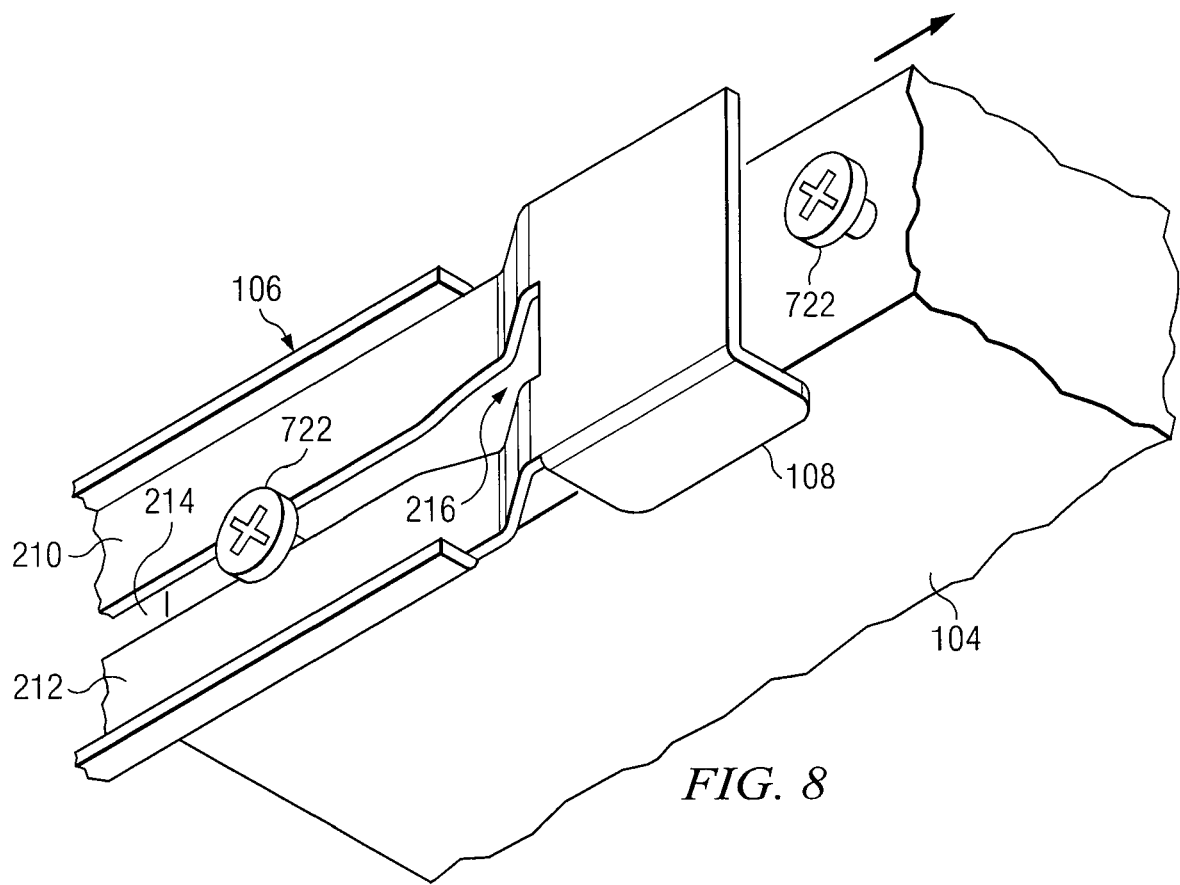
FIG. 8 illustrates a rail supporting an information handling system during installation of the information handling system into the rail, in accordance with the certain embodiments of present disclosure.

FIG. 8 illustrates a rail 106 supporting an information handling system 104 during installation of IHS 104 into rail 106, according to certain embodiments of the present disclosure. Rail 106 includes an upper support structure 210, lower support structure 212, slot 214 defined between upper support structure 210 and lower support structure 212, and shelf 108, extending forward from a front end opening 216 of slot 214. IHS 104 includes at least one guide structure 722 configured for insertion into slot 214. In some embodiments, guide structures 722 may include shoulder screw nuts protruding from each side of IHS 104. In other embodiments, guide structures 722 may be any other appropriately shaped protuberances such as rivets or bolts configured for insertion into slot 214.

Figure 9:
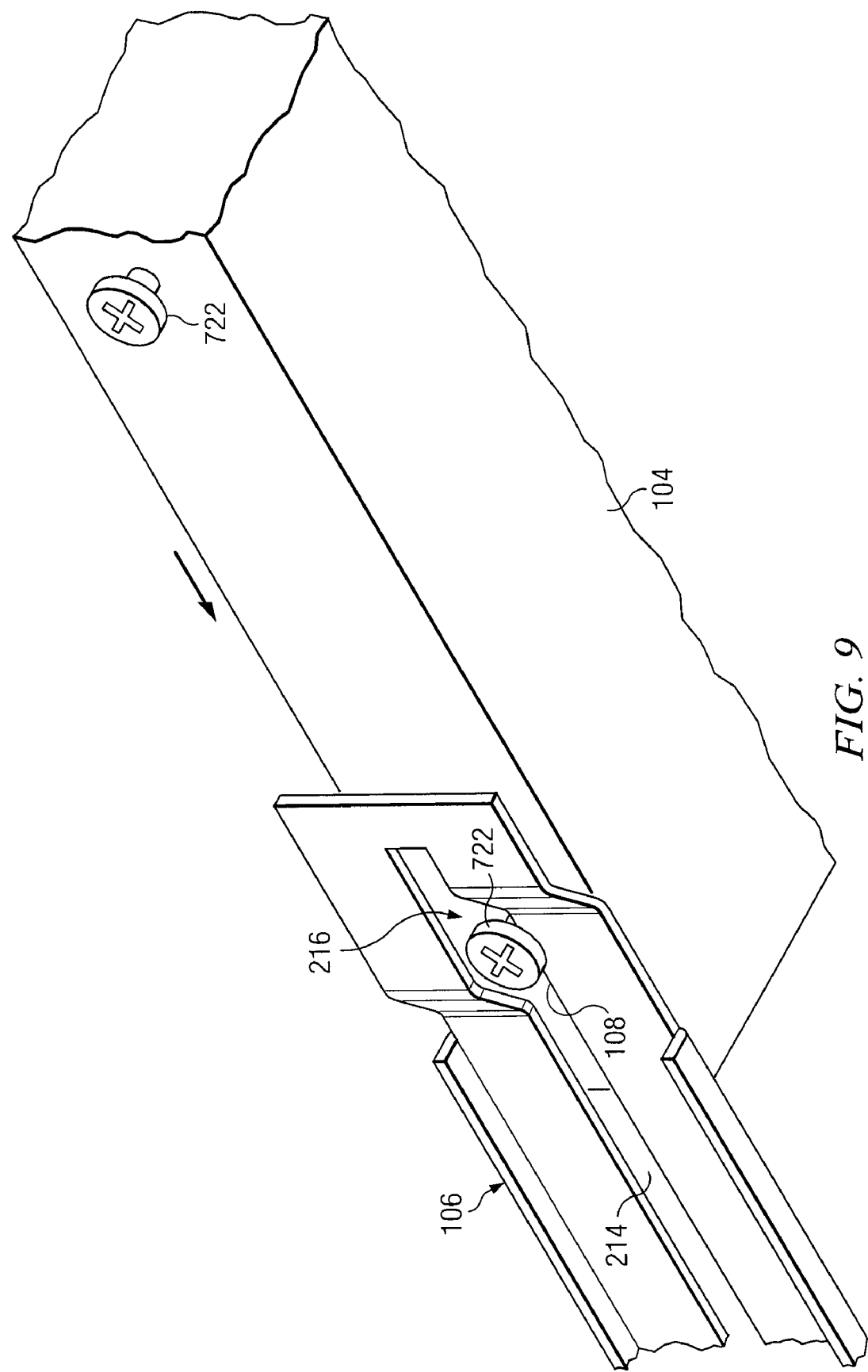
FIG. 9 illustrates an example shelf (e.g., any of the example shelves shown in FIGS. 3-6) supporting a portion of an information handling system, in accordance with certain embodiments of the present disclosure.

FIG. 9 illustrates an example shelf 108 supporting a portion of an information handling system 104 from below IHS 104, according to certain embodiments of the present disclosure. Shelf 108 shown in FIG. 9 may be any shelf according to the teachings of this disclosure, e.g., any of the shelves 108 shown in FIGS. 3-6. Shelf 108 may support a rear portion of IHS 104 during installation by a person so that the person may more easily align a guide structure 722 of an IHS 104 with a front end opening 216 of a slot 214 formed in each of a pair of rails 106. Thus, for example, a person may rest the back edge of an IHS 104 on shelf 108 of a pair of rails 106 and then slide the IHS back such that the guide structures 722 slide into front end openings 216 of slots 214 formed in each of the rails 106. During removal of the IHS from rail 106 by a person, shelf 108 may support a rear portion of IHS 104 after the last guide structure 722 has exited from slots 214 formed in the pair of rails 106 so that the person need not immediately support the entire weight of IHS 104, reducing the chances of dropping or damaging IHS 104.

Although the present disclosure has been described in detail, it should be understood that various changes, substitutions, and alterations can be made hereto without departing from the spirit and the scope of the disclosure as defined by the appended claims.

What is claimed is:

1. A rack system for supporting one or more information handling systems, comprising:
    a rack; and
    one or more rails coupled to the rack and configured to support one or more information handling systems;
    wherein at least one of the rails includes:
        an upper support structure having a front end proximate to a front end of the rail and extending toward a back end of the rail;
        a lower support structure having a front end proximate to the front end of the rail and extending toward the back end of the rail;
        a slot defined between the upper and lower support structures, the slot having a front end opening proximate to the front end of the rail, and the slot extending toward the back end of the rail;
        wherein the slot is configured to receive a guide structure of the information handling system; and
        a shelf extending forward from the front end opening of the slot and extending in a substantially horizontal plane, wherein:
            the shelf is configured to support a portion of the information handling system when the guide structure is not received in the slot;
            the shelf is not coupled to any other rail; and
            the shelf in its entirety is more proximate to the front end of the rail than are the front end of the upper support structure and the front end of the lower support structure.

2. The system of claim 1, wherein the slot includes a flared portion, the flared portion flaring away from a center line of the slot in a vertical direction.

3. The system of claim 1, wherein the front end opening includes a flared portion, the flared portion flaring away from a center line of the slot in a vertical direction.

4. The system of claim 1, wherein the shelf is located below a bottom portion of the lower support structure.

5. The system of claim 1, wherein a portion of the front end of the rail flares outwardly relative to an opposing rail.

6. A rail system for supporting one or more information handling systems, comprising:
    one or more rails configured to support one or more information handling systems;
    wherein at least one of the rails includes:
        an upper support structure having a front end proximate to a front end of the rail and extending toward a back end of the rail;
        a lower support structure having a front end proximate to the front end of the rail and extending toward the back end of the rail;
        a slot defined between the upper and lower support structures, the slot having a front end opening proximate to the front end of the rail, and the slot extending toward the back end of the rail;
        wherein the slot is configured to receive a guide structure of the information handling system; and
        a shelf extending forward from the front end opening of the slot and extending in a substantially horizontal plane, wherein:
            the shelf is configured to support a portion of the information handling system when the guide structure is not received in the slot;
            the shelf is not coupled to any other rail; and
            the shelf in its entirety is more proximate to the front end of the rail than are the front end of the upper support structure and the front end of the lower support structure.

7. The system of claim 6, wherein the slot includes a flared portion, the flared portion flaring away from a center line of the slot in a vertical direction.

8. The system of claim 6, wherein the front end opening includes a flared portion, the flared portion flaring away from a center line of the slot in a vertical direction.

9. The system of claim 6, wherein the shelf is located below a bottom portion of the lower support structure.

10. The system of claim 6, wherein a portion of the front end of the rail flares outwardly relative to an opposing rail.

11. A rack system, comprising:
    a rack;
    a plurality of information handling systems; and
    one or more rails coupled to the rack and configured to support one or more information handling systems;
    wherein at least one of the rails includes:
        an upper support structure having a front end proximate to a front end of the rail and extending toward a back end of the rail;
        a lower support structure having a front end proximate to the front end of the rail and extending toward the back end of the rail;
        a slot defined between the upper and lower support structures, the slot having a front end opening proximate to the front end of the rail, and the slot extending toward the back end of the rail;
        wherein the slot is configured to receive a guide structure of the information handling system; and
        a shelf extending forward from the front end opening of the slot and extending in a substantially horizontal plane, wherein:
            the shelf is configured to support a portion of the information handling system when the guide structure is not received in the slot;
            the shelf is not coupled to any other rail; and
            the shelf in its entirety is more proximate to the front end of the rail than are the front end of the upper support structure and the front end of the lower support structure.

12. The system of claim 11, wherein the slot includes a flared portion, the flared portion flaring away from a center line of the slot in a vertical direction.

13. The system of claim 11, wherein the front end opening includes a flared portion, the flared portion flaring away from a center line of the slot in a vertical direction.

14. The system of claim 11, wherein the shelf is located below a bottom portion of the lower support structure.

* * * * *